United States Patent
Ausserlechner (10) Patent No.: US 7,057,232 B2
(45) Date of Patent: Jun. 6, 2006

(54) SEMICONDUCTOR STRUCTURE WITH INTEGRATED SHIELD

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/733,961

(22) Filed: Dec. 11, 2003

(65) Prior Publication Data

US 2004/0135197 A1 Jul. 15, 2004

(30) Foreign Application Priority Data

Dec. 11, 2002 (DE) ................... 10257870

(51) Int. Cl.
*H01L 29/788* (2006.01)
(52) U.S. Cl. ............. 257/316; 257/317; 365/185
(58) Field of Classification Search ............ 257/316, 257/317; 365/185
See application file for complete search history.

(56) References Cited

U.S. PATENT DOCUMENTS

| | | | |
|---|---|---|---|
| 4,970,565 A | 11/1990 | Wu et al. | |
| 5,068,697 A | 11/1991 | Noda et al. | |
| 5,440,510 A * | 8/1995 | Caprara et al. | 365/185.04 |
| 6,301,158 B1 | 10/2001 | Iwahashi | |
| 6,614,684 B1 * | 9/2003 | Shukuri et al. | 365/185.05 |
| 2001/0025980 A1 | 10/2001 | Bottini et al. | |
| 2002/0102794 A1 | 8/2002 | Hisamune et al. | |

* cited by examiner

*Primary Examiner*—Edward Wojciechowicz
(74) *Attorney, Agent, or Firm*—Maginot, Moore & Beck (57) ABSTRACT

A semiconductor structure comprises a memory element, which comprises a floating gate, a control electrode, which is capacitively coupled to the floating gate, wherein a signal for controlling the memory element is applicable to the control electrode, as well as a shield, which is arranged isolated from the floating gate and covers it fully.

3 Claims, 7 Drawing Sheets

SEMICONDUCTOR STRUCTURE WITH INTEGRATED SHIELD

BACKGROUND OF THE INVENTION

1. Field of the Invention

The present invention relates to semiconductor structures having a memory element, which is protected from interferences by an integrated shield.

2. Description of the Related Art

With an increasing packing density of electronic elements, such as transistors, which are integrated on a chip, the significance of efficient protective measures against electromagnetical or electrostatic interferences increases. If memory elements, for example, are constructed with the help of transistors, the stored amount of charge might no longer be detected correctly, if, for example either the amount of the stored amount of charge or its sign have changed significantly due to an electrical interference field. This is particularly problematic, if EEPROMs are used for permanent storage of data (EEPROM=electrically erasable programmable read only memory), since an EEPROM cell is particularly susceptible against external interference fields.

Figure 1:
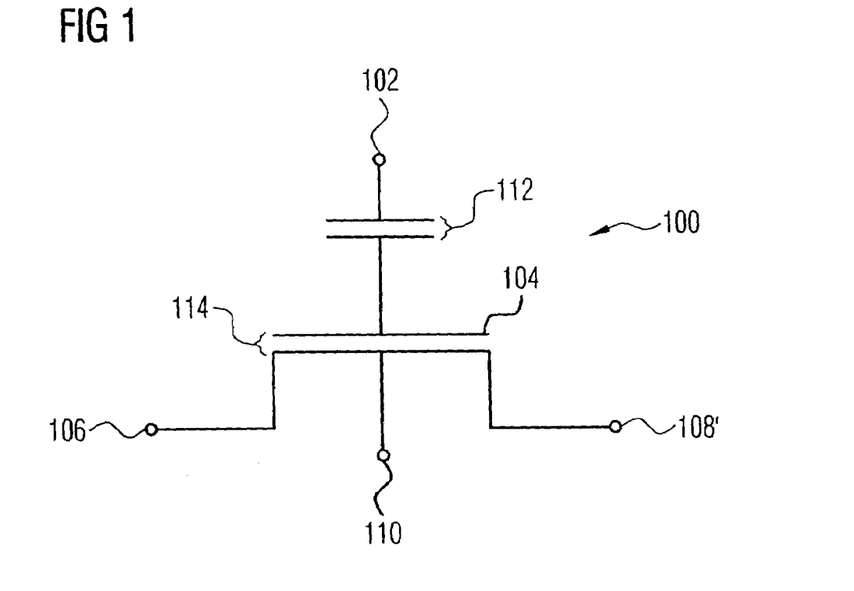
FIG. 1 a schematic diagram of an EEPROM cell.

Principally, an EEPROM cell is constructed similar to a MOS transistor (MOS=metal oxide semiconductor). In FIG. 1, a schematic diagram of an EEPROM cell (100) is illustrated, as it is known from the prior art. First, the EEPROM cell is characterized by a control terminal 102, a floating gate electrode 104, a source terminal 106, a drain terminal 108 as well as a substrate or bulk terminal 110. A coupling capacity 112 is effective between the control terminal 102 and the floating gate 104, and the known MOS capacity 114 is effective between the floating gate 104 and the bulk terminal 110.

Figure 2:
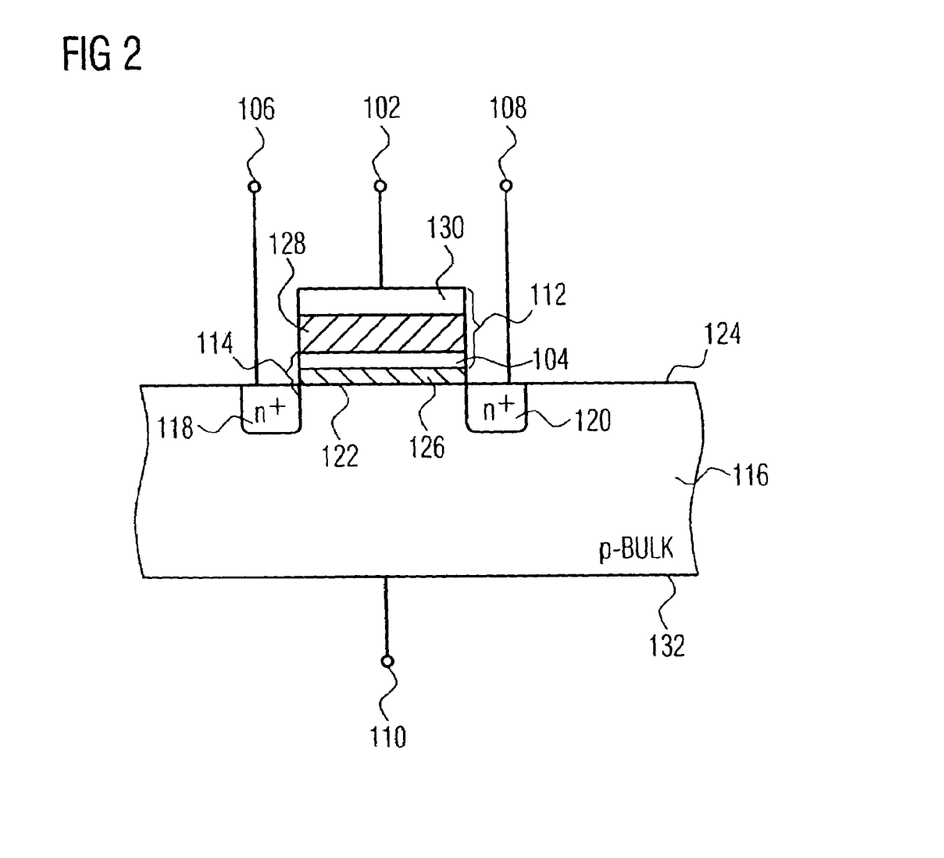
FIG. 2 a setup of an EEPROM cell.

In FIG. 2, the setup of an EEPROM cell is illustrated, as it is known from the prior art. In a substrate (bulk) 116, such a p-substrate (p bulk), an n⁺ source area 118 and an n⁺ drain area 120 are formed. A channel area 122 is formed between the n⁺ source area 118 and the n⁺ drain area 120. A thin oxide layer 126 is formed on a surface 124 of the substrate 116, where the floating gate 104 is formed. An oxide layer 128 is formed on the floating gate, where again a control electrode 130 (control gate=CG) is formed, which is connected to the control terminal 102. The n⁺ source area 118 is connected to the source terminal 106, and the n⁺ drain area 120 is connected to the drain terminal 108. The substrate 116 is connected to the bulk terminal 110 at the surface 132 opposite to the surface 124. The coupling capacity 112 is formed by the control electrode 130, the floating gate 104 and the oxide layer 128 lying between them. The MOS capacity 113 is formed by the floating gate 104, the thin oxide layer 126 and the substrate 116. In the setup of the EEPROM illustrated in FIG. 2, this is an n-type EEPROM. The EEPROM cell can also be formed as p-type EEPROM. In this case, the substrate would be an n-substrate or an n-well would be formed in the p-substrate 116, where a p⁺ source area and a p⁺ drain area would be formed. In this case, the n-substrate and the n-well, respectively, would be the bulk of the p-type EEPROM.

The difference between the EEPROM cell and a MOS transistor is that two electrodes are provided for controlling in the EEPROM cell, the floating gate 104 (FG) and the control electrode 130 (CG). The floating gate 104 is directly opposite to the MOS channel area 122, which is formed between the source area 118 and the drain area 120, only separated by the thin oxide 126, and is not connected to further parts of the circuit in an electrically conductive way, which is why it is electrically "floating". By the other, mostly thicker, oxide 128, the control electrode 130 is separated from the floating gate 104 and connected to the control terminal 102. Thus, seen from the outside, the EEPROM cell is similar to a MOS transistor with source, drain, bulk and gate terminals. Particularly, in the EEPROM cell, an effective threshold voltage, $U_{th,eff}$ can be defined, like in the MOS transistor. In an n-type EEPROM, which corresponds to an NMOS, the control electrode 130 has to be raised above the source potential at least by $U_{th,eff}$, so that the channel formed between the drain area 128 and the source area 126 becomes conductive.

By different physical mechanisms, such as by Fowler Nordheim tunneling (FN) or Hot Carrier Injection (HCI), an excess or a deficiency of net charge can be generated at the floating gate 104. Therefore, a comparatively high voltage of a positive or negative polarity has to be applied between control terminal 102 and the bulk terminal 110, whereby the respectively smallest information unit (bit) is stored in the form of this net charge or not, whereby, for example, a logical "1" or a logical "0" can be realized. It can be seen that after this programming the changed net charge at the floating gate 104 leads to a change of the effective threshold voltage. If the floating gate 104 is not charged, the respective effective threshold voltage is called UV level. This designation stems from the fact that an uncharged state can be achieved by irradiating the floating gate of the EEPROM cell with UV light for several minutes.

If a high positive potential is applied to the control terminal 102 due to the programming, a negative net charge (electron excess) occurs at the floating gate 104, as long as the coupling capacity 112 is larger than the MOS capacity 114, which is always assumed in the following. The effective threshold voltage will therefore be shifted to positive values; it is therefore larger than the UV level. If the control terminal 102 is provided with a strongly negative potential against the substrate 116 in the programming, a positive net charge (electron deficiency) is obtained at the floating gate 104, and the threshold voltage becomes smaller than the UV level.

In the following, the programming is explained with an example of the Fowler Nordheim Tunnel mechanism, as it is known from the prior art.

If a positive voltage ramp is applied at the control terminal 102, first, at small voltages, a separation of the voltage into two fractional voltages occurs, namely a voltage at the coupling capacity 112 (coupling capacitor), and a second voltage between the floating gate 104 and the MOS channel and substrate 116, respectively, which drops at the MOS capacity 114. According to the common rules for capacitive voltage dividers, the ratio of the coupling capacity 112 to the MOS capacity 114 is inverse proportional to a ratio of the fractional voltages dropping at these two capacities. For that reason, an effort is made to make the coupling capacity larger than the MOS capacity 114, so that a portion of the total applied voltage as high as possible drops at the thin oxide 126 of the MOS capacity 114, and affects the Fowler Nordheim tunneling there. This is achieved constructively by making the lateral dimensions of the thin oxide 126 defined by a layout smaller than those of the oxide 126 between the control electrode 130 and the floating 104. If, therefore, the voltage applied to the control terminal 102 is ramped up, the two fractional voltages rise as well, until finally the larger fractional voltage—namely the one at the thin oxide 126—achieves a field strength of, for example, about 8 MV/cm to about 9 MV/cm. Then, the Fowler Nordheim tunneling begins, i.e. a small stream flows above the thin oxide 126 from the floating gate 104 to the MOS channel and the substrate 116, respectively. The rise time of the voltage ramp should thereby be so small that those processes run more or less statically. Thus, a small Fowler Nordheim tunnel current is enough to load the coupling capacity 112 sufficiently fast, so that the potential at the floating gate 104 remains, for example, at a value of Um=8 . . . 9 MV/cm*D. Thereby, D indicates a thickness of the thin oxide 126.

If a maximum programming voltage is finally Up, a difference between Up and Um is stored at the coupling capacity 112. This can be expressed as follows:

|UP|−Um=|Uc|=|Q(FG)|*Cc

Thereby, Q(FG) is the charge stored at the floating gate 104, and Cc is the value of the coupling capacity 112. In the above expression, for simplicity reasons, the sign was omitted, which reflects in the amount-like version of the charge stored at the floating gate 104. The normal rise times of the voltage ramps are between 100 μs . . . 10 ms.

If, however, the rise time of the programming pulse is shorter, the small Fowler Nordheim tunnel stream is no longer sufficient to load the coupling capacity 112 sufficiently fast, so that the voltage at the thin oxide 126 rises above Um, and damages the thin oxide 126 more than absolutely necessary. This pre-damage is shown by the fact that the floating gate 104 looses the charge over time, and it comes to a data loss, which, of course, has to be avoided.

A bit error occurs, if, for example, high voltages at the thin oxide 126 (also referred to as gate oxide) of the MOS capacity 114 change a charge state of the floating gate 104, whereby, for example, the sign of the stored charge changes. Often, however, it is already sufficient for a bit error when merely the amount of the charge stored at the floating gate is reduced sufficiently, without changing the sign. The reason therefore is that it is difficult in practice to apply the exact UV level as an ideal discrimination value between the positive and the negative charge at the floating gate 104 at the control electrode 102. On the one hand, there are the discrimination value varies with temperature, on the other hand, the strong variations from batch to batch, disc to disc, chip to chip and even within a chip in dependency of a position of the memory element (memory cell) in the chip, which are common in the memory in the semiconductor technology.

In practice, it can happen that an integrated circuit (IC) is subject to a high electrical field. This is particularly the case in electrically "rough" environment, such as in the use in an automobile. Therefore, it is extremely important in security relevant applications that the IC functions properly despite an adverse electrical environment, particularly that it is not damaged thereby. For a function of the IC, often those data are relevant which are stored in the EEPROM cell. As an example, imagine an integrated magnetic-field sensor, which is to detect a blocking of a wheel in an ABS system (ABS=anti blocking system), and whose calibration data are stored on chip in an EEPROM. If these calibration data are, for example, lost by an electrical field pulse, the blocking of a wheel is continuously not detected, or in another extreme case, never detected. The consequences of such damage can be dramatic.

Particularly high electric fields can occur in ESD events (ESD=electrostatic discharge). Here, again, that case is to be seen as worst case, where the discharge takes place above a housing to the IC. Thereby, a tip of an ESD pistol is held directly to a surface of the IC, and, for example, charged to several kilovolt against ground. If the IC is applied to ground at the same time, an ESD flash can discharge above that part of a compound of the housing directly under the tip of the ESD pistol. If an EEPROM cell is within this area on the surface of IC, it can be damaged thereby.

In the following, the orders of the influence of an ESD event to an EEPROM cell are estimated.

As a model, the tip of the ESD pistol and the ESD cell is replaced by a small ball, since the capacity of a ball spark gap can be calculated analytically without too much effort as follows:

$$C = \pi\varepsilon_0(2R+g)\sum_{p=1}^{\infty}\frac{1}{\sinh\left(p\,\mathrm{arsinh}\left(1+\frac{g}{2R}\right)\right)}$$

Thereby, R is the radius of the ba s and g the distance of their facing surfaces, $\varepsilon_0$ is the electrical field constant. For thin housings, particularly with magnetic-field sensors, g=0.15 mm has to be assumed. arsinh ( . . . ) is the arcus sinus hyperbolic function and p is the sum index. Depending on the radius of the ball R, the following stray capacitances result from the above expression:

| R | C |
|---|---|
| 100 nm | 5.6 aF |
| 1 μm | 56 aF |
| 10 μm | 0.59 fF |
| 100 μm | 7.4 fF |
| 1 mm | 8.7 fF |

In practice, naturally, the EEPROM cell is very small (smaller than 1 μm), the tip of an ESD diode or the fingertip of a human being is comparatively large (larger than 1 mm), so that the above model of the ball spark gap is not very well suitable for an exact calculation of the influence of the ESD event on an EEPROM cell. Still, this model can be used for a best-case estimation. The stray capacity between the fingertip and the EEPROM cell is definitely larger than the one between two balls with 1 μm radius, since the fingertip is significantly larger than 1 μm and according to the above table, the capacity rises also with increasing radius. Even this small stray capacity of 56 aF between fingertip and floating gate 104 effects that at an assumed coupling capacity 111 Cc=20 fF already the 20/0.056=357-th part of the ESD voltage is applied to the thin oxide. Thus, at a value of the ESD voltage of, for example, 4.6 kV, 13 V are applied to the thin oxide. This is already sufficient for the FN tunneling for a thickness of 12 nm assumed in this example.

Due to the above-described problem it is thus necessary to shield the floating gate 104 appropriately. This can, for example, be realized by covering the floating gate 104 fully with the control electrode 130, so that the control electrode 130 electrically shields the floating gate 104. This shield effect can be insufficient, when the control electrode 130 is not low-resistively connected to the substrate 116 of the EEPROM cell. Assumed that a person who is electrostatically charged touches the IC. The stray capacity between the fingertip of the person and the control electrode 130 raises the potential of the control electrode 130, when the control electrode 130 is not brought to a defined potential by other circuit parts. This case occurs particularly when the IC is not supplied with a voltage, because then the inner nodes of an MOS circuit have a high impedance, since no sufficient potentials are present at the gates of the belonging MOS transistors in order to switch those to being conductive. The coupling capacity 112 formed by the floating gate 104, the oxide layer 128 and the control electrode 130 influences then subsequently the potential of the floating gate 104, so that its charge state might change.

SUMMARY OF THE INVENTION

It is the object of the present invention to provide a semiconductor structure with an efficient shield of a floating gate arranged in a semiconductor structure.

In accordance with a first aspect, the present invention provides a semiconductor structure having a memory element with a floating gate, a control electrode, which is capacitively coupled to the floating gate, wherein a signal for controlling the memory element is applicable to the control electrode, and a shield, which is arranged isolated from the floating gate and covers it fully.

The present invention is based on the knowledge that both the floating gate and the control electrode can be formed during a semiconductor manufacturing process such that the floating gate is fully covered with a further conductive layer and can thus be shielded.

Preferably, both the floating gate and the control electrode are covered with a conductive layer, which is preferably electrically isolated from the floating gate and the control electrode, wherein the conductive layer is low-resistively connected, preferably with the bulk of the EEPROM cell (e.g. p-substrate of the MOS transistor or ah n-sink of a PMOS transistor). Since the bulk of the EEPROM is mostly also connected to the system ground (e. g. 0 V), the conductive layer is thus also connected to the system ground.

The conductive layer can be realized by inserting an additional conductive layer during the semiconductor manufacturing process, which covers the appropriately arranged floating gate. Mostly, the floating gate and the control electrode overlap to some extend anyway, so that the conductive layer (shield) merely has to lie above both electrodes.

If the wiring levels and the floating gate and the control electrode are arranged in a predetermined positional relationship to each other, the formation of an additional conductive layer can be omitted during the semiconductor manufacturing process, since the shield can be realized by a wiring level. Since the wiring levels have a low impedance, they also have a good shielding effect, even at transient events (such as the actual ESD impact, "flash"), due to the low penetration depths. This is another reason why the shield should be connected to the bulk of an EEPROM with an impedance as low as possible.

Since there is a constantly increasing number of wiring levels (supply levels) in modern semiconductor technologies, it should be considered which of the wiring levels is ideally suited for a realization of the shield. This problem will be discussed below.

If the control electrode is formed such that it lies below the floating gate (see FIG. 7), a remarkable stray capacity arises between the floating gate (particularly between the part 104b much larger than 104a, 104c), and the wiring levels lying above it, which form the inventive shield. However, this is disadvantageous in programming the EEPROM, since this stray capacity decreases the efficiency of the coupling capacity, i.e. the shield is applied to ground and prevents with its stray capacity against the floating gate the floating gate from following a programming pulse at the control electrode. Thus, it is to be preferred to use an upper wiring level for the shield, i.e. a wiring level whose vertical distance to the floating gate is as large as possible. The distance between the used wiring level and the floating gate should, however, still be minuscully small against a housing thickness over this part of the IC, so that the shield effect is sufficiently good. Otherwise, the electric field lines surround the shield and form again a stray capacity between, for example, a fingertip and an ESD pistol, respectively, and the floating gate.

Figure 8:
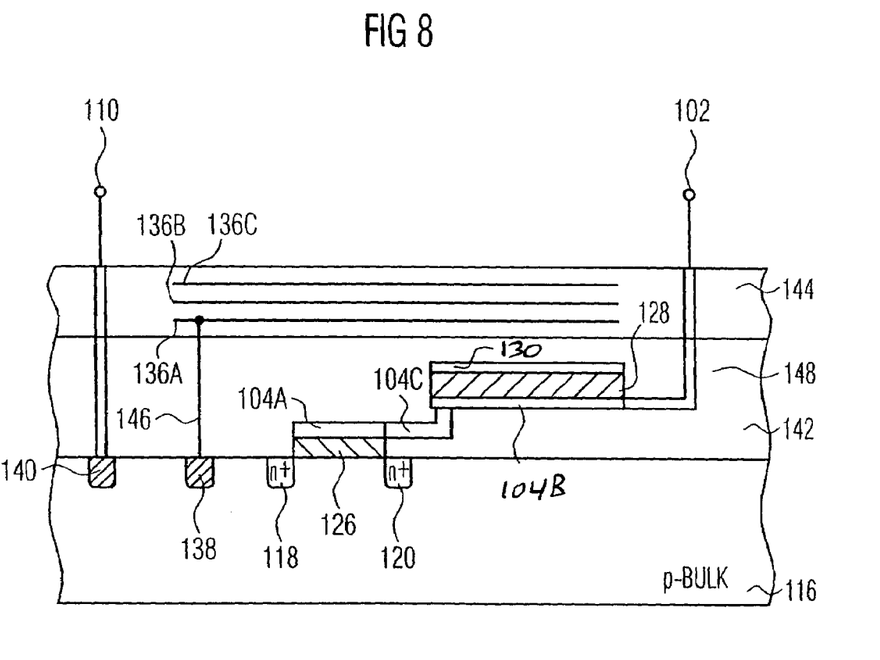
FIG. 8 a further embodiment of a semiconductor structure according to the present invention.

If the floating gate is formed such that it is below the control electrode (see FIG. 8), then it is optimal in this case to use a lower wiring level lying above the floating gate and above the control electrode, i.e. a wiring level whose vertical distance to the floating gate is as low as possible, for the shield, since the stray capacity of the lower wiring level to the control electrode, which is respectively large in this case, does not matter. The reason therefore is that the control electrode is controlled, for example, by a voltage source in programming, which can charge this stray capacity against ground without difficulty such that an appropriate programming voltage arises. If, however, the stray capacity between 104a and the shield already significantly reduces the coupling efficiency of the coupling capacity to the floating gate, it can even be advisable in that case, to form the shield in a higher wiring level (such as 136b, 136c). Thereby, the coupling efficiency is defined as follows:

$$0 < Um/Up < 1.$$

To minimize the above-mentioned surrounding of the field lines around the shield, the shield should not only cover the floating gate and the control electrode flush, but should protrude for several micrometers. Generally, the shield should protrude so far as a normal distance of the shield to the floating gate of the EEPROM cell (which means in a vertical direction to the chip).

It is an object of the present invention that by inserting a conductive layer during the semiconductor manufacturing process, the floating gate is shielded against external interferences independent of a spatial extension of the control electrode, so that less bit errors are caused due to electrostatical interferences.

It is another object of the present invention that a good shield of the floating gate can be achieved without increasing the costs of the semiconductor manufacturing process, by arranging the floating gate and the overlaying wiring levels already during the manufacturing process such that the floating gate is shielded by one or by several wiring levels.

Although above an electrostatical shield was discussed primarily, it is also necessary to keep transient (i.e. electromagnetical) fields away from the floating gate by a shield, which is also achieved by the inventive shield.

BRIEF DESCRIPTION OF THE DRAWINGS

Preferred embodiments of the present invention will be discussed in more detail below with reference to the accompanying drawings. They show.

DESCRIPTION OF THE PREFERRED EMBODIMENTS

In the following description of the preferred embodiments, elements, which have already been explained with reference to FIGS. 1 and 2 are provided with the same reference numbers. There will be no further description of these elements. Further, the same elements in the Figures are provided with the same reference numbers.

Figure 3:
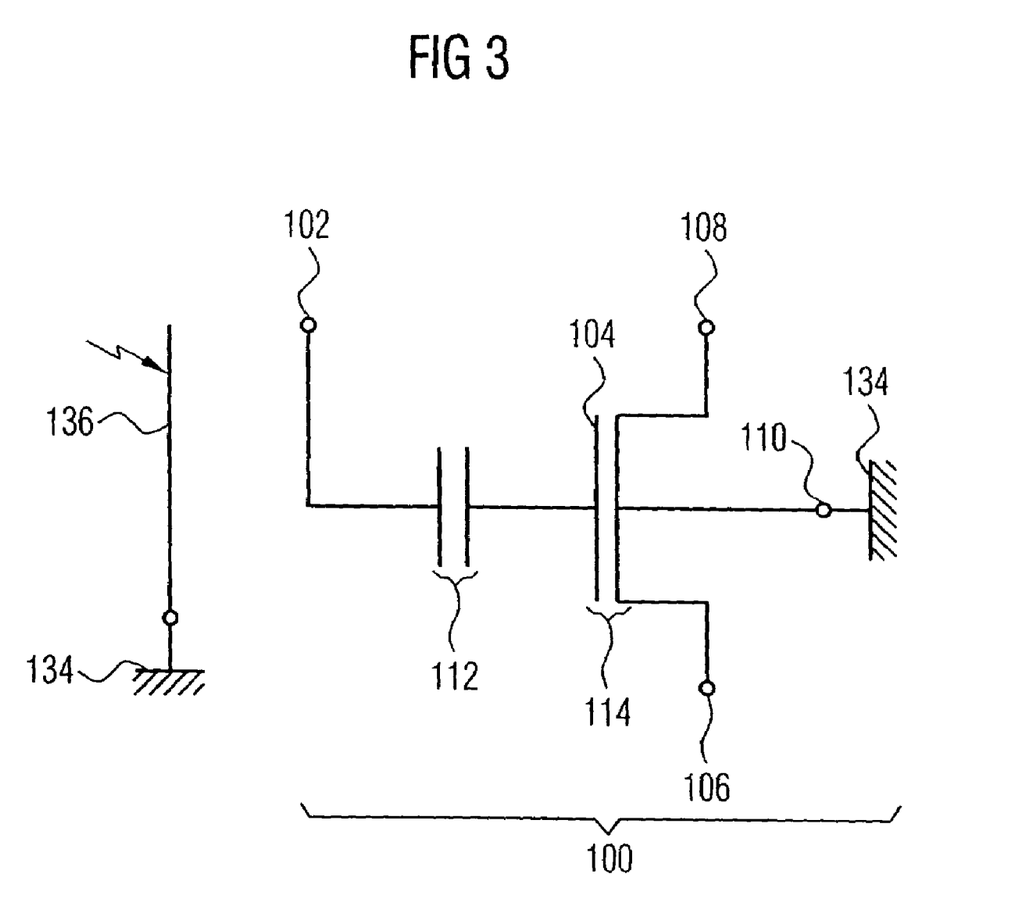
FIG. 3 a schematic diagram of a first embodiment of an EEPROM cell according to the present invention.

FIG. 3 shows a schematic diagram of the inventive semiconductor structure. An EEPROM cell 100 is shown, as it has already been described with reference to FIG. 1. As can be seen, the bulk terminal 110 is connected to a potential 134, e. g. ground. According to the invention, a shield 136 is provided, which is also connected to the potential 132 and shields the floating gate 104, as it is schematically illustrated.

Figure 4:
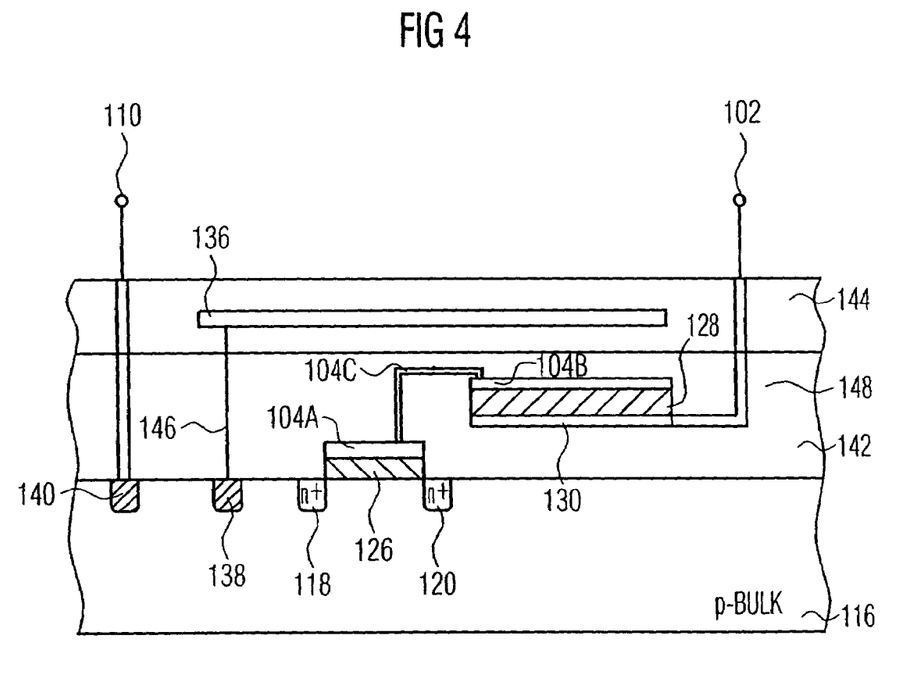
FIG. 4 a setup of a semiconductor structure according to the embodiment illustrated in FIG. 3.

FIG. 4 shows an embodiment of a setup of a semiconductor structure according to the embodiment illustrated in FIG. 3. The semiconductor structure (n type EEPROM) comprises, similar to FIG. 2, a substrate (p bulk) 116. The $n^+$ source area 118 and the $n^+$ drain area 120 are formed in the substrate 116. The drain and source terminals illustrated in FIG. 2 are not illustrated in FIG. 4 for simplicity. Further, a first $p^+$ area 138 and a second $p^+$ area 140 are formed in a substrate 116. A thin oxide layer 126 is formed on the substrate 116, which extends on the surface of the substrate 116 between the $n^+$ source area 118 and the $n^+$ drain area 120.

The floating gate is formed by a first floating gate electrode 104a, a second floating gate electrode 104b and a connection electrode 104c between the first and the second floating gate electrode. The second floating gate electrode 104b is arranged laterally shifted with regard to the first floating gate electrode 104a. The control electrode 130 is disposed opposite to the second floating gate electrode, with a lesser vertical distance to the surface of the substrate 116. The oxide layer 128 is formed between the second floating gate electrode 104b and the control electrode 130. Thus, as can be seen in FIG. 4, the floating gate is formed above the control electrode 130 with reference to the surface of the substrate 116. The first floating gate electrode 104a, the second floating gate electrode 104b, the connection electrode 104c, the control electrode 130 and the oxide layers 126, 128 are formed in a first portion 142 above the substrate 142.

The shield 136, which is, for example, formed as a metallizing layer, is disposed in a second portion 144 above the first portion 142. The shield 136 is arranged such that it fully covers all portions 104a, 104b, 104c of the floating gate, and preferably protrudes on the side, respectively. The shield 136 is further connected to the $p^+$ area 138, which is formed in the substrate 116, via a connection 146, so that the potential applied to the substrate 116 is applicable above the bulk terminal 110, which is connected to the area 140 and designed towards the top, to the shield 136 so that it is accessible from the top, as it is illustrated in FIG. 3. Thereby, the shield 136 keeps an electromagnetical and an electrostatical influence away from the sensible floating gate, wherein the conductive bulk (substrate 116) provides a shielding effect from below. The control electrode 130 is connected to the control terminal 102 via a connection 148, which extends through the second portion 144.

In the embodiment illustrated in FIG. 4, the shield 136 is formed continuously. For the case illustrated in FIG. 4 that the floating gate has a plurality of portions 104a, 104b, 104c, the shield 136 can be formed according to the invention, such that it also comprises a plurality of conductive areas, which mainly lie on the same potential and cover the plurality of portions of the floating gate.

The EEPROM cell can be realized in a single well CMOS process with an analog option by a standard NMOS transistor and, for example, a standard poly-poly capacitor, when the gate of the NMOS is connected to one of the two electrodes of the poly-poly capacitor to the floating gate. According to the invention, the floating gate is arranged such that it is fully covered by the shield 136 (the low impedance layer) towards the top. Above that, this layer is conductively connected to the bulk of the NMOS (for example directly realized in a substrate), which is formed by a substrate of the IC. Thereby, the stored charge at the floating gate is protected from ESD and other voltage events as well as from electromagnetical fields, since the floating gate is electrostatically shielded towards the top by the shield 136 and towards the bottom by the likewise conductive substrate 136, such as a p-substrate, which is mostly supported in its shielding effect by a still better conductive supply frame lying below it. Therefore, the shield 136 (the screen) should cover all parts of the floating gate and protrude sufficiently on the sides. Since the p-substrate 116 is normally put on reference potential, this requirement is identical with putting the shield 136 also put on the reference potential.

Analogous considerations hold true for an EEPROM cell, consisting of a PMOS transistor by using an n-substrate (exchange of n- and p-doping) and a p-substrate with n-well, respectively.

Figure 5:
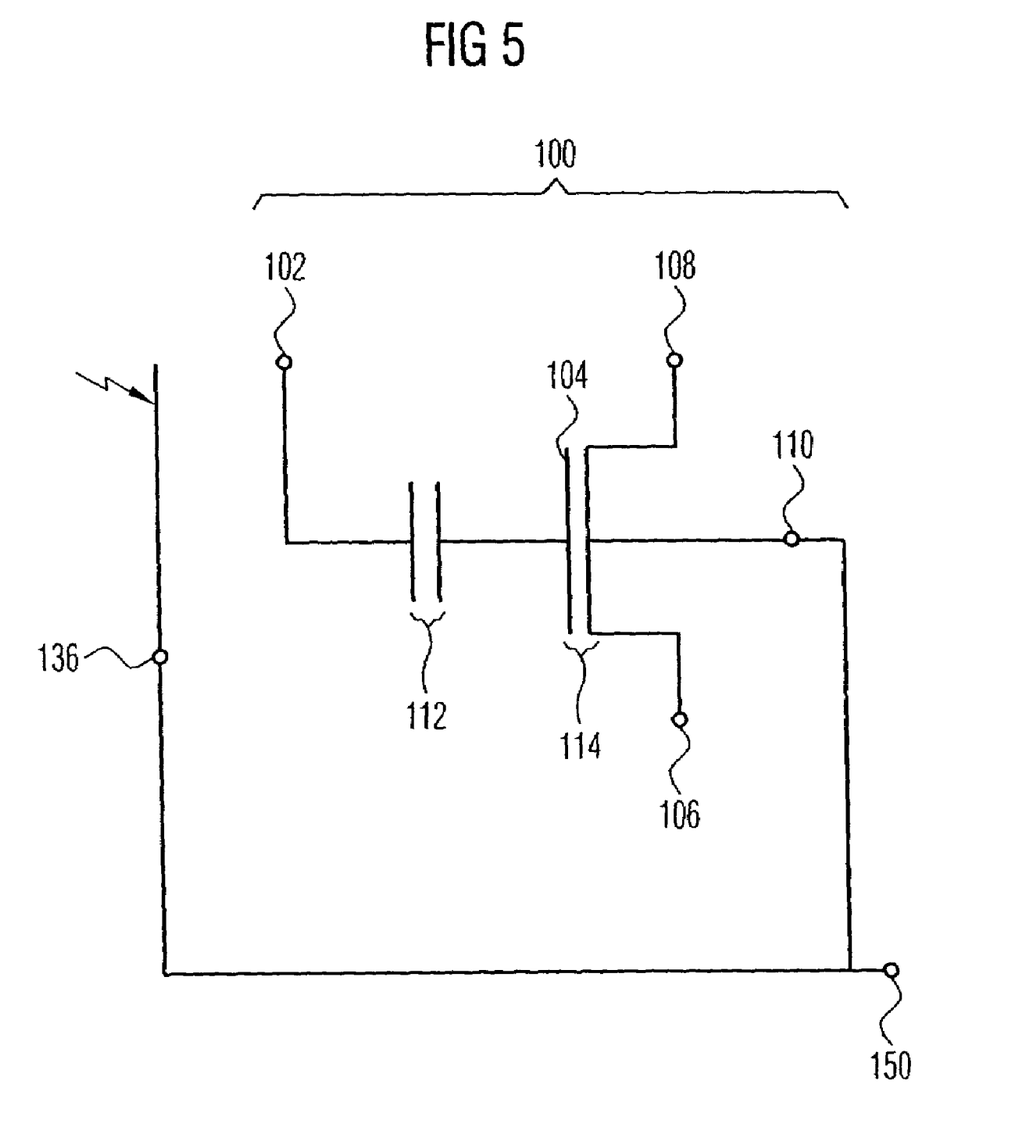
FIG. 5 a schematic diagram of a further embodiment of an EEPROM cell according to the present invention.

FIG. 5 shows a schematic diagram of a further embodiment of an EEPROM cell according to the present invention. Different to the embodiment illustrated in FIG. 3, the EEPROM cell illustrated in FIG. 5 has a terminal 150. The bulk terminal 110 is connected to the terminal 150. Above that, the shield 136 is connected to the terminal 150, so that the shield 136 is directly connected to the bulk terminal 110. Above the terminal 150, a potential is applicable both to the bulk terminal 110 and to the shield 136. This embodiment is thus advantageous for CMOS transistors with their own well, which is not identical to the substrate.

Figure 6:
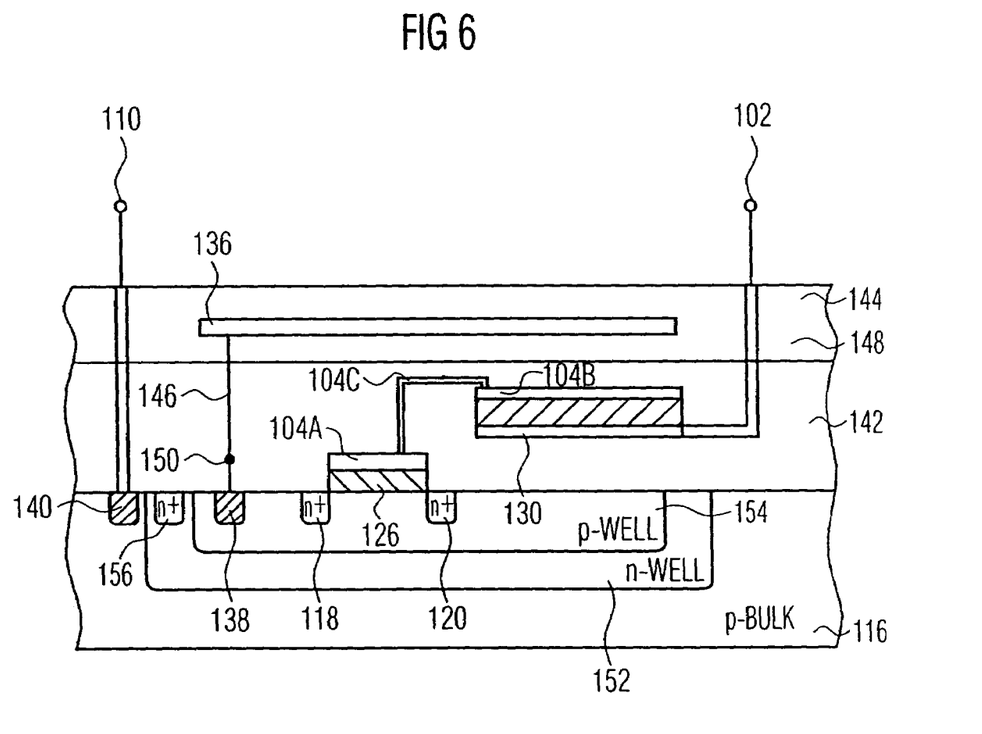
FIG. 6 a setup of a semiconductor structure according to the embodiment illustrated in FIG. 5.

FIG. 6 showed a setup—similar to FIG. 4—of a semiconductor structure according to the embodiment illustrated in FIG. 5. Different to FIG. 4, an n-well 152 is formed in a substrate 116, wherein again a p-well 154 is formed, wherein the source area 118 and the drain area 120 as well as the first $p^+$ area 138 are formed. Further, an $n^+$ area 156 is formed in the n-well 152, above which a potential, e.g. 3 Volt, is applicable to the n-well 152. Above the first $p^+$ area 134, a potential is applicable to the p-well and thus also to the shield 136, as it is schematically shown by the terminal 150. By the fact that the shield 136 and the p-well terminal 150 are on the same potential, it is achieved that the floating gate 104 is shielded both by the shield 136 as well as by the p-well 154.

The significant difference between the embodiment illustrated in FIG. 3 and FIG. 5 is that in the embodiment according to FIG. 5, the common potential of p-well 154 and shield 136 is freely available, while in the embodiment according to FIG. 3, the common potential is identical to ground.

By the fact that the p-well 154 covers the floating gate formed of portions 104a, 104b, 104c from below, it is achieved that the floating gate is arranged between the shield 136 and the p-well 154, whereby a better shield is achieved from below.

According to the invention, the floating gate 104, which is accessible towards the top, is preferably fully covered by a low-impedance layer (shield 136), and this layer is connected to the substrate 116 and a p-well 154, respectively. Thereby, the stored charge at the floating gate 104 is protected from ESD and other high voltage events, since the floating gate 104 is shielded towards the top by the shield 136, and towards the bottom by the likewise conductive substrate and the p-well, respectively. Therefore, the shield 136 should preferably cover all parts of the floating gate 104 and protrude sufficiently on the sides. Preferably, in the case of a p-well, it is extended such that all parts of the floating gate 104 are covered seen from below.

Figure 7:
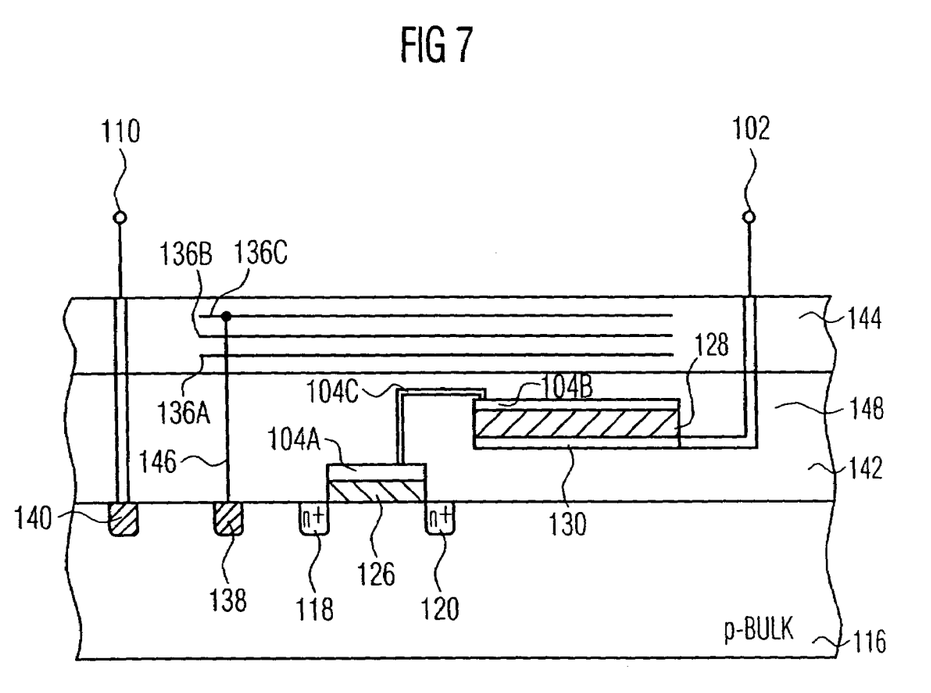
FIG. 7 a further embodiment of a semiconductor structure according to the present invention.

In FIG. 7, another embodiment of the semiconductor structure is illustrated according to the present invention. Different to the embodiment illustrated in FIG. 4, the semiconductor structure illustrated in FIG. 7 has a plurality of metallizing levels or supply levels 136a to 136c in the second portion 144. It should be noted here, that an arbitrary number of supply levels could be provided.

In the embodiment illustrated in FIG. 7, the floating gate (portions 104a, 104b, 104c) is disposed over the control electrode 130, i.e. the vertical distance of the control electrode 130 to the substrate 116 is smaller than the distance of the second floating gate electrode 104a to the substrate 116. For such an arrangement of the floating gate 104 it is advantageous to use a supply level or wiring level for the shield, whose distance to the floating gate is highest, since the stray capacity between floating gate and shield should be kept small. In the embodiment illustrated in FIG. 7, the supply level 136c is chosen as shield, which is connected to the substrate 116 like in FIG. 4.

The supply levels 136a, 136b, 136c are several elements out of which the shield can be formed. If, for example, the first supply level 136a is arranged such that it is not optimally accessible to establish a connection to the substrate 116, the second supply level 136b, for example, can be used as shield element. If the extension of the supply level is not sufficient to cover the floating gate, several supply levels or portions of several supply levels can be interconnected to obtain a sufficient coverage.

FIG. 8 shows a further embodiment of a semiconductor structure according to the present invention. Similar to FIG. 7, the floating gate is here also formed by the first floating gate electrode 104a, the second floating gate electrode 104b and the connection electrode 104c between the first and the second floating gate electrode. The second floating gate electrode 104b is arranged laterally shifted with regard to the first floating gate electrode 104a. The control electrode 130 is arranged opposite to the second floating gate electrode, but with a higher vertical distance to the surface of the substrate 116. Thus, the floating gate is formed below the control electrode with reference to the surface of the substrate 116.

In this case, however, different to FIG. 7, the first supply level 136c, whose distance to the control electrode 130 is the smallest, is connected to the substrate 116.

Here, it should be noted that the embodiments discussed above with reference to an n-type EEPROM are analogously valid for a p-type EEPROM, wherein then the source and the drain areas are p-doped and formed either in an n-substrate or in an n-well in a p-substrate.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor structure, comprising:

a substrate;

a memory element comprising a gate including a gate oxide layer on the substrate, a floating gate, and a control electrode capacitively coupled to the floating gate, wherein a signal for controlling the memory element is applicable to the control electrode, wherein the floating gate comprises a first floating gate portion and a second floating gate portion connected with each other, the first floating gate portion being formed on the gate oxide layer, the second floating gate portion being laterally and vertically shifted from the first floating gate portion, and wherein the control electrode and the second floating gate portion are disposed opposite to each other with an oxide layer therebetween; and a plurality of metallization layers formed in a portion above the memory element and fully covering the floating gate, wherein at least one of the metallization layers is used as a shield layer for the floating gate, wherein in case the distance of the control electrode to the surface of the substrate is smaller than the distance of the second floating gate portion to the surface of the substrate, the shield is formed by connecting a metallization layer farthest from the second floating gate portion to the substrate, and wherein in case the distance of the second floating gate portion to the surface of the substrate is lower than the distance of the control electrode to the surface of the substrate, the shield is formed by connecting a metallization layer closest to the control electrode to the substrate.

2. The semiconductor structure according to claim 1, wherein the memory element is formed at least partly in the substrate, wherein a potential is applicable to the substrate and/or to the well, and wherein, when the memory element is formed at least partly in the well in the substrate, the metallization layer forming the shield is connected to the well.

3. The semiconductor structure according to claim 2, wherein the substrate and/or the well shields the floating gate.

* * * * *